(12) United States Patent
Chuang et al.

(10) Patent No.: US 8,202,791 B2
(45) Date of Patent: Jun. 19, 2012

(54) METHOD FOR GENERATING TWO DIMENSIONS FOR DIFFERENT IMPLANT ENERGIES

(75) Inventors: Chun-Chieh Chuang, Tainan (TW); Dun-Nian Yaung, Taipei (TW); Jen-Cheng Liu, Hsin-Chu (TW); Jeng-Shyan Lin, Tainan (TW); Wen-De Wang, Minsyong Township, Chiayi County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 12/404,852

(22) Filed: Mar. 16, 2009

(65) Prior Publication Data
US 2010/0233871 A1  Sep. 16, 2010

(51) Int. Cl.
*H01L 21/425* (2006.01)
(52) U.S. Cl. .................. 438/527; 257/E21.346
(58) Field of Classification Search .......... 438/527, 438/514, 519, 521, 528, 510
See application file for complete search history.

(56) References Cited

U.S. PATENT DOCUMENTS

| | | | | |
|---|---|---|---|---|
| 4,038,107 A * | 7/1977 | Marr et al. | ..... | 438/527 |
| 4,366,613 A * | 1/1983 | Ogura et al. | ..... | 438/252 |
| 4,970,173 A * | 11/1990 | Robb | ..... | 438/273 |
| 5,070,029 A * | 12/1991 | Pfiester et al. | ..... | 438/231 |
| 6,274,443 B1 * | 8/2001 | Yu et al. | ..... | 438/299 |
| 6,297,098 B1 | 10/2001 | Lin et al. | | |
| 2003/0228731 A1 * | 12/2003 | Hayashi | ..... | 438/224 |
| 2006/0057821 A1 * | 3/2006 | Lee et al. | ..... | 438/459 |
| 2007/0238253 A1 * | 10/2007 | Tucker | ..... | 438/289 |
| 2009/0001050 A1 * | 1/2009 | Min | ..... | 216/51 |

* cited by examiner

*Primary Examiner* — Charles Garber
*Assistant Examiner* — Reema Patel
(74) *Attorney, Agent, or Firm* — Haynes and Boone, LLP

(57) ABSTRACT

A method for fabricating an integrated circuit device is disclosed. The method includes providing a substrate; forming a first hard mask layer over the substrate; patterning the first hard mask layer to form one or more first openings having a first critical dimension; performing a first implantation process on the substrate; forming a second hard mask layer over the first hard mask layer to form one or more second openings having a second critical dimension; and performing a second implantation process.

20 Claims, 6 Drawing Sheets

METHOD FOR GENERATING TWO DIMENSIONS FOR DIFFERENT IMPLANT ENERGIES

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Conventional IC processing often involves performing one or more implantation processes on a substrate (or wafer). For example, each implantation process may involve forming a photoresist layer; patterning the photoresist layer to form an implantation pattern; and performing the implantation process. It is often desired for each implantation pattern to be associated with a different critical dimension. Thus, for each implantation process performed, a separate patterning and masking process is utilized to form the desired critical dimension. It has been observed that the traditional processes for performing one or more implantation processes associated with varying critical dimensions is less cost-effective than desirable. Further, traditional processes present difficulty in adequately decreasing (or shrinking) spacing (i.e., the critical dimension).

Accordingly, what is needed is a method for manufacturing an integrated circuit device that addresses the above stated issues.

SUMMARY

A method for fabricating an integrated circuit device is provided. In one embodiment, the method comprises providing a substrate; forming a first hard mask layer over the substrate; patterning the first hard mask layer to form one or more first openings having a first critical dimension; performing a first implantation process; forming a second hard mask layer over the first hard mask layer to form one or more second openings having a second critical dimension; and performing a second implantation process.

In one embodiment, the method comprises providing a substrate; forming a first hard mask layer over the substrate; forming a photoresist layer over the first hard mask layer; patterning the photoresist layer to form one or more first openings; patterning the first hard mask layer to form one or more second openings substantially similar to the one or more first openings; removing the photoresist layer; performing a first implantation process on the one or more second openings; forming a second hard mask layer over the first hard mask layer to form one or more third openings, wherein the one or more third openings are smaller than the one or more second openings; and performing a second implantation process on the one or more third openings.

In one embodiment, the method comprises providing a substrate; defining a first implant pattern and a second implant pattern, wherein defining the first and second implant patterns utilizes a single masking step; and performing one or more implantation processes on the substrate, wherein at least one implantation process is associated with a first critical dimension and at least one implantation process is associated with a second critical dimension.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
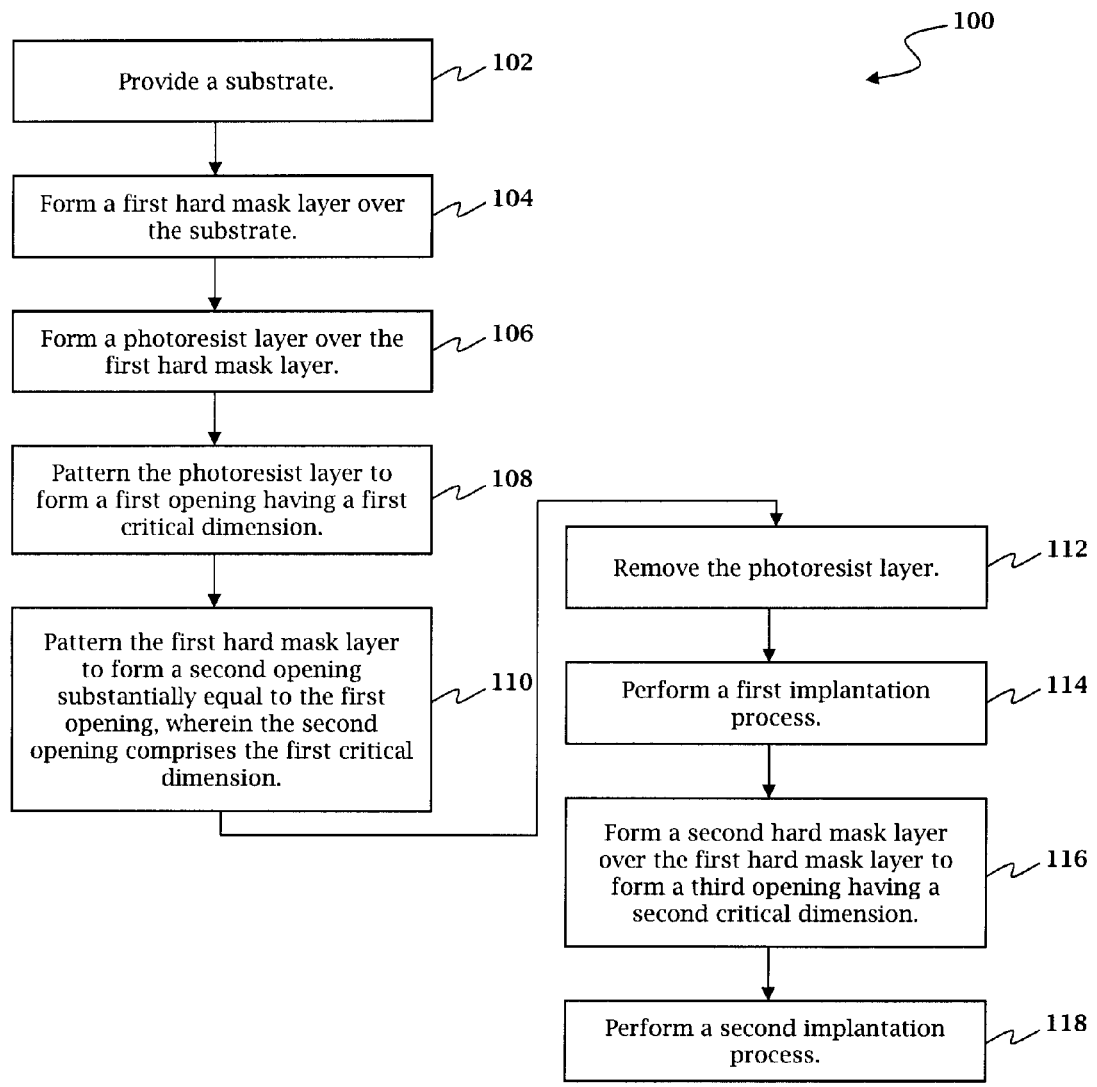
FIG. 1 is a flow chart of a method for fabricating a semiconductor device according to aspects of the present embodiments.

The present disclosure relates generally to methods for manufacturing integrated circuit devices, and more particularly, to a cost-effective method for manufacturing an integrated circuit.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
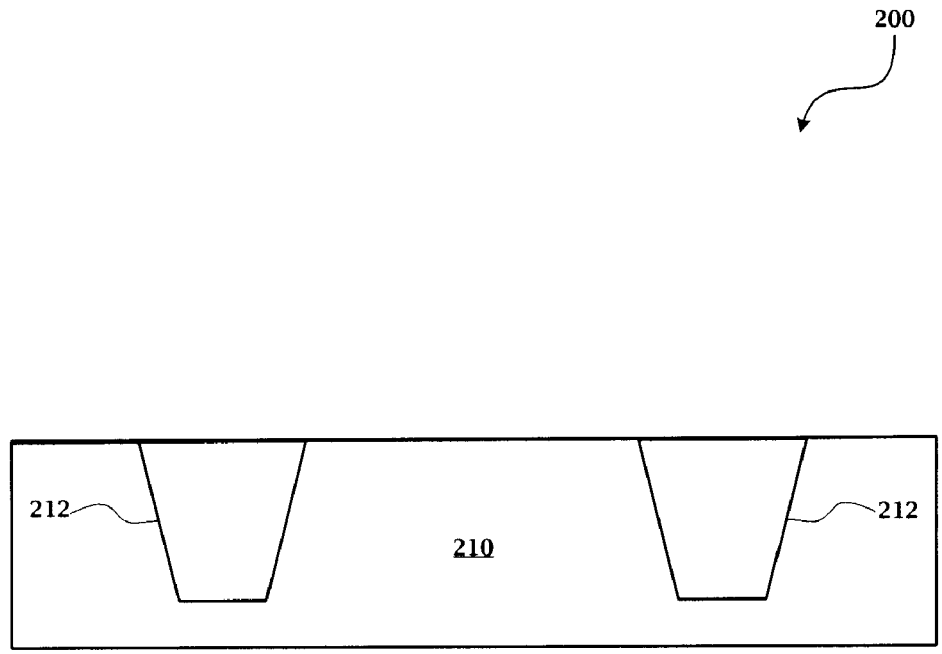
FIGS. 2A-2I are various cross-sectional views of embodiments of a semiconductor device during various fabrication stages according to the method of FIG. 1.
Figure 2B:
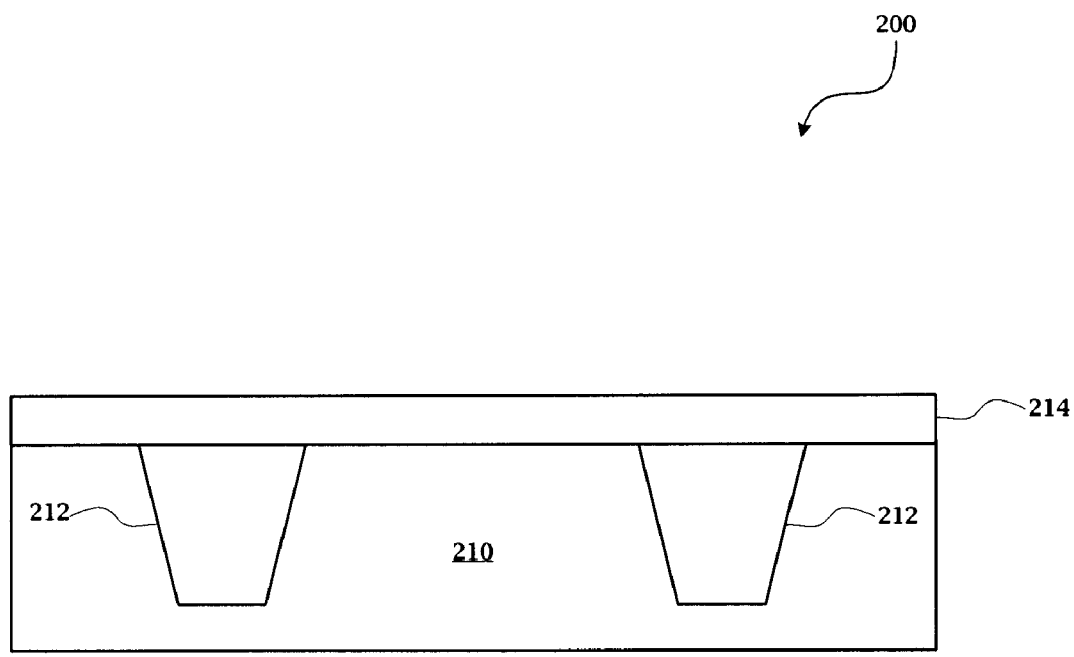
Figure 2C:
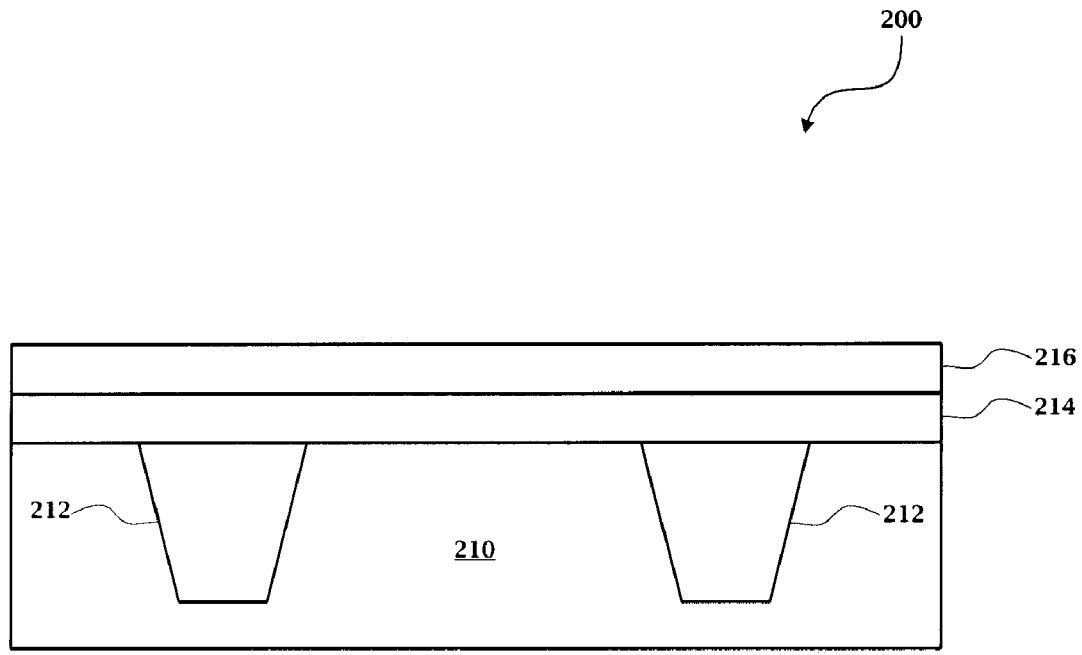
Figure 2D:
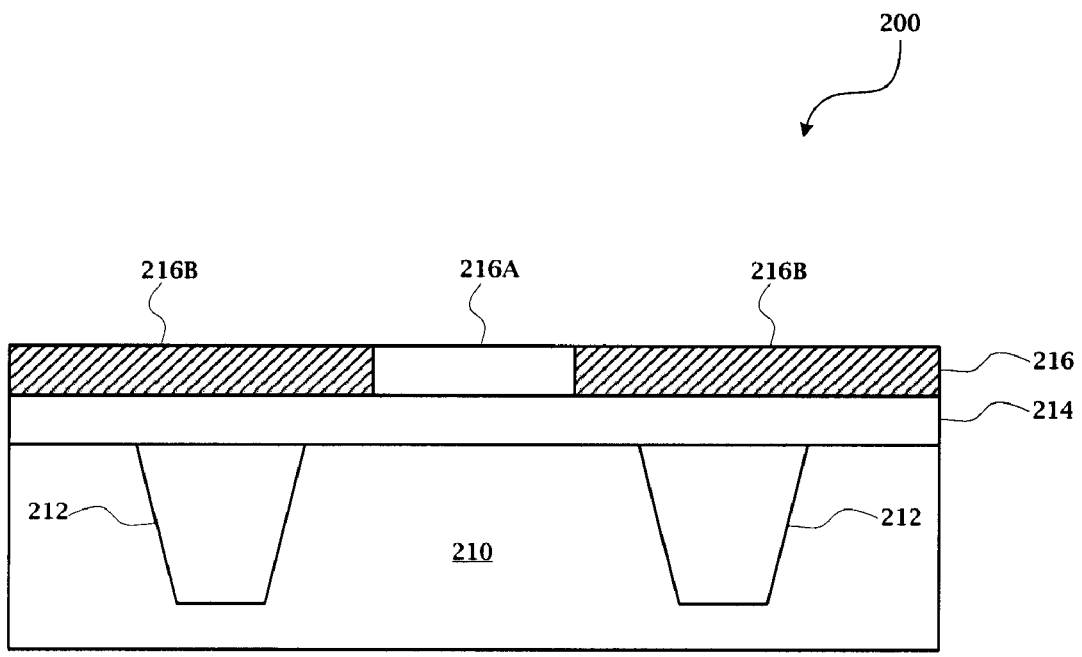
Figure 2E:
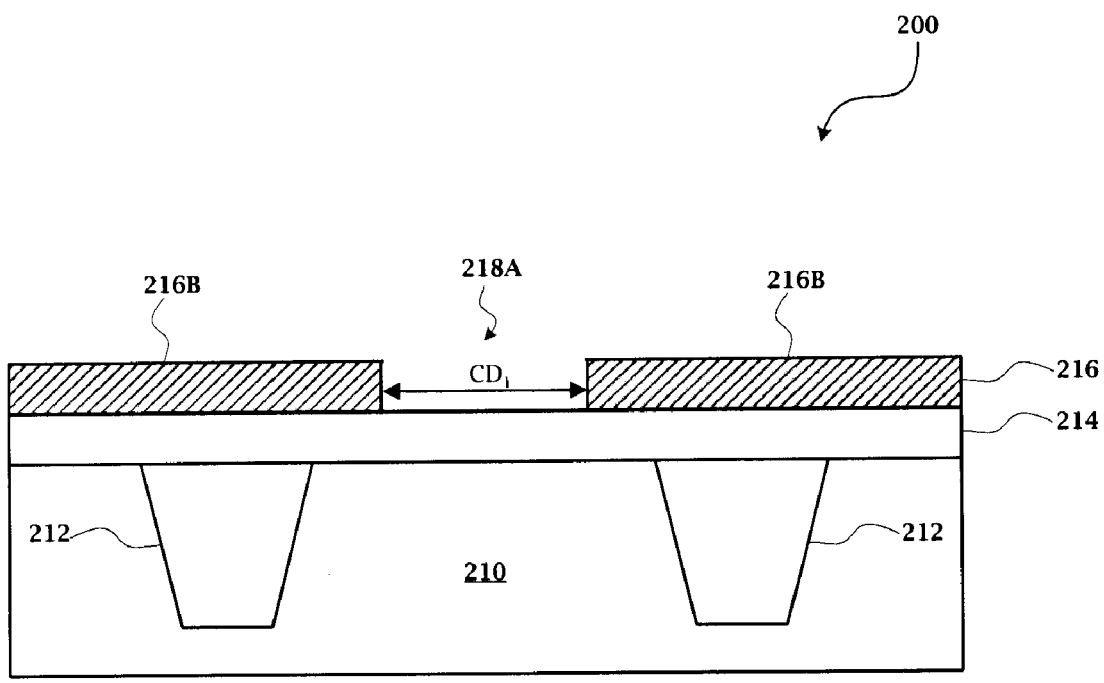
Figure 2F:
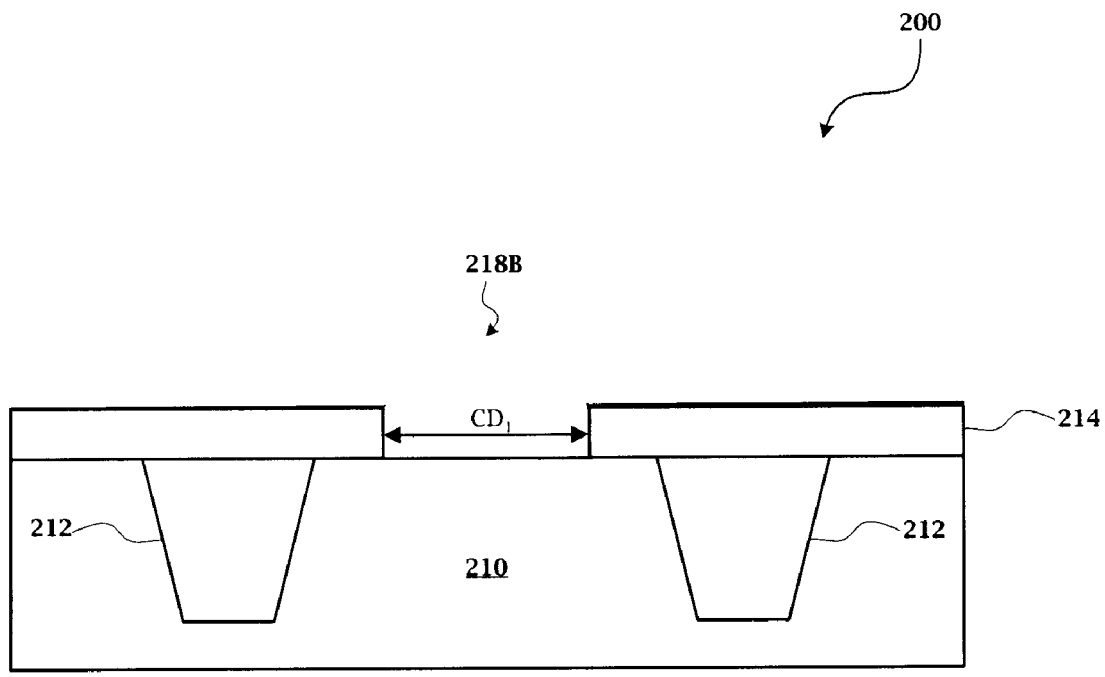
Figure 2G:
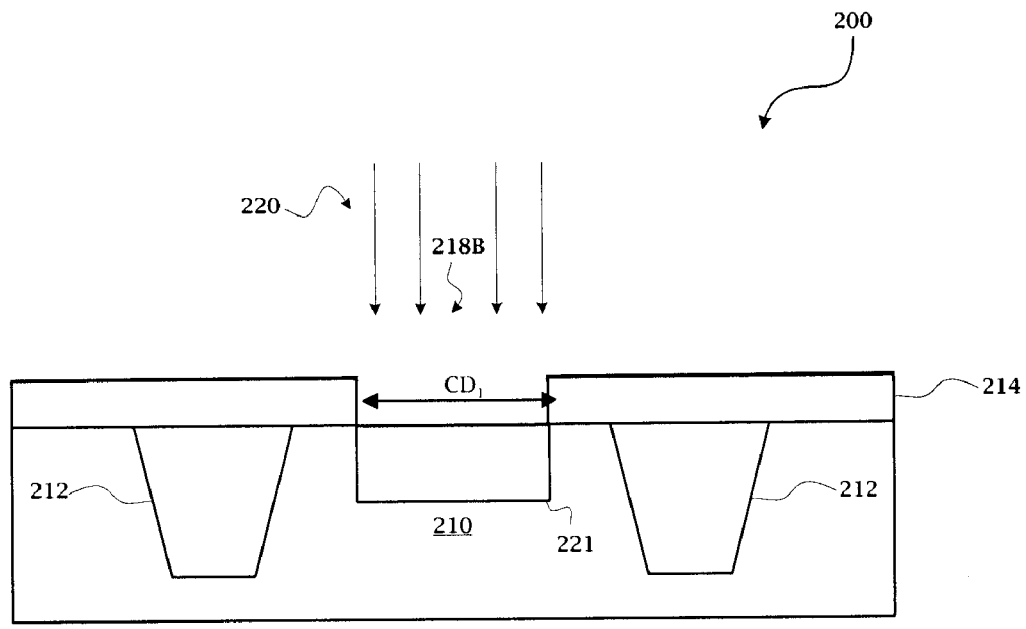
Figure 2H:
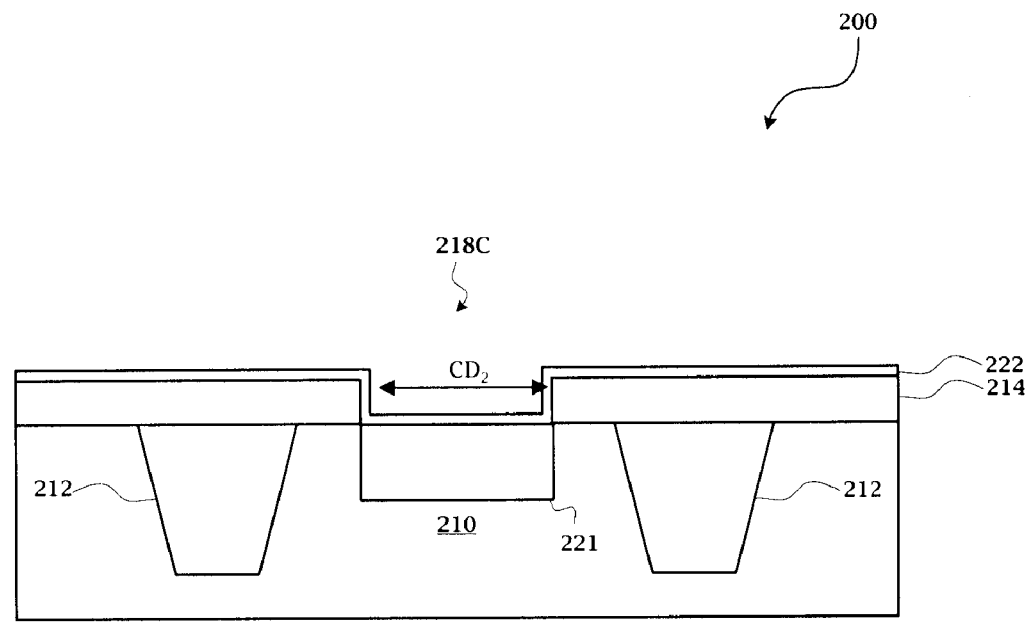
Figure 2I:
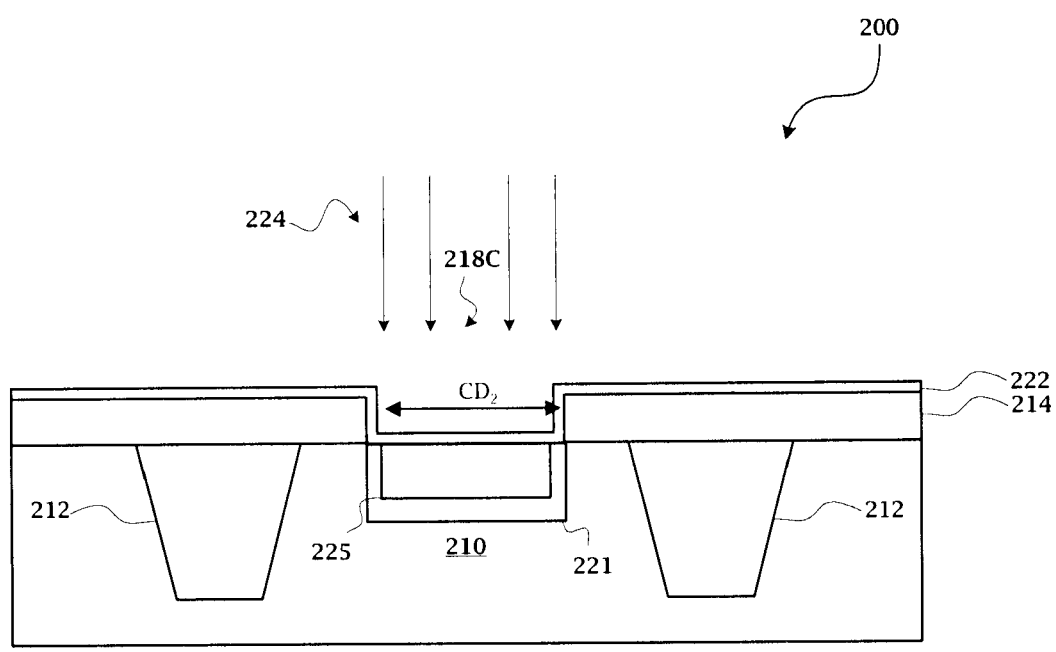

With reference to FIGS. 1 through 2I, a method 100 and a semiconductor device 200 are collectively described below. FIG. 1 is a flow chart of one embodiment of the method 100 for making the semiconductor device 200. FIGS. 2A-2I are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIGS. 1 and 2A, the method 100 begins at step 102 wherein a substrate 210 having at least one isolation region 212 is provided. In the present embodiment, the substrate 210 is a semiconductor substrate comprising silicon. The substrate 210 may comprise an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. Still, in other examples, the substrate 210 may comprise a non-semiconductor material, such as glass.

The semiconductor device 200 includes at least one isolation region 212 formed on the semiconductor substrate 210. The isolation region 212 may utilize isolation technology, such as local oxidation of silicon (LOCOS) or shallow trench isolation (STI), to define and electrically isolate various regions of the substrate, such as active and passive regions. In the present embodiment, the isolation region 212 includes a STI. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

The substrate 210 includes one or more various doping configurations depending on design requirements as known in the art (e.g., p-type substrate regions and/or n-type substrate regions). In the present embodiment, the substrate 210 may include doped regions. The doped regions may be formed directly on the semiconductor substrate, in a p-well structure, in a n-well structure, in a dual-well structure, or using a raised structure. The doped regions may be doped with p-type or n-type dopants. For example, the doped regions may be doped with p-type dopants, such as boron or $BF_2$; n-type dopants, such as phosphorus or arsenic; and/or combinations thereof. The semiconductor substrate 210 may further include various active regions, such as regions configured for an n-type metal-oxide-semiconductor transistor device (referred to as an NMOS) and regions configured for a p-type metal-oxide-semiconductor transistor device (referred to as a PMOS). It is understood that the semiconductor device 200 may be formed by complementary metal-oxide-semiconductor (CMOS) technology processing, and thus some processes are not described in detail herein.

The one or more various doped regions may be formed by any suitable process, such as one or more implantation processes. In the present embodiment, the substrate 210 comprises doped regions with varying critical dimensions. For example, a doped region with a first critical dimension may form a deep p-well structure, and a doped region with a second critical dimension may form a p-well structure (e.g., cell p-well). Forming the doped regions with the first and second critical dimensions also utilizes varying implant energies and doping concentrations. In conventional processing, a separate mask is used to form a doped region with each critical dimension desired. Thus, referring to the example above, two masks and two processes are utilized to form the doped region with the first critical dimension and the doped region with the second critical dimension. More specifically, a conventional process may involve forming a first photoresist layer over the substrate; patterning the first photoresist layer with a first photomask to form a first implant pattern having a first critical dimension; forming the first doped region by a first implantation process (using a first implant energy and a first doping concentration); removing the first photoresist layer; forming a second photoresist layer over the substrate; patterning the second photoresist layer with a second photomask to form a second implant pattern having a second critical dimension; and forming the second doped region by a second implantation process (using a second implant energy and a second doping concentration). It has been observed that conventional processing for providing various implantation processes at varying critical dimensions increases manufacturing costs. Further, reducing spacing (for example, critical dimension) is difficult, particularly when a high implantation energy process is utilized.

Accordingly, the present embodiments provide a method for performing one or more implantation processes associated with varying critical dimensions utilizing a single mask (photomask or reticle, collectively referred to as mask). More specifically, in the present embodiment, in method 100, two implantation processes associated with a first critical dimension and a second critical dimension are performed utilizing a single mask. At step 104, a first hard mask layer 214 is formed over the substrate 210 as illustrated in FIG. 2B. In the present embodiment, the hard mask layer 214 comprises silicon oxide, silicon oxynitride, and/or silicon nitride. The first hard mask layer 214 may comprise spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, TEOS oxide, plasma enhanced oxide (PE oxide), high aspect ratio deposition process (HARP) oxide, porous polymeric materials, non-porous polymeric materials, other suitable low-k dielectric materials, other suitable materials, and/or combinations thereof. The first hard mask layer 214 is formed by any suitable process, such as physical vapor deposition (PVD), chemical vapor deposition (CVD), plasma enhanced CVD (PECVD), rapid thermal CVD (RTCVD), atomic layer deposition (ALD), metal organic CVD (MOCVD), high density plasma CVD (HPCVD), sputtering, plating, spin-on coating, other suitable processes, and/or combinations thereof. The first hard mask layer 214 may include a single layer or multiple layers. Further, the first hard mask layer 214 comprises any suitable thickness.

Referring to FIG. 1 and FIGS. 2C-2F, a portion of the first hard mask layer 214 is removed to form one or more openings having a first critical dimension. At step 106, a photoresist layer 216 is formed over the first hard mask layer 214 as shown in FIG. 2C. The photoresist layer 216 may be formed by any suitable process, including the processes described herein (e.g., spin-on coating). The photoresist layer 216 comprises any suitable thickness. Then, at step 108, the photoresist layer 216 is patterned to form one or more first openings having a first critical dimension. The photoresist layer 216 is patterned by a conventional photolithography process and/or processes to create one or more first portions 216A and one or more second portions 216B as shown in FIG. 2D. In the present embodiment, the patterning of the photoresist layer 216 utilizes a single mask to form the one or more first and second portions 216A, 216B. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Further, in some embodiments, the photolithography patterning and exposing process may implement krypton fluoride (KrF) excimer lasers, argon fluoride (ArF) excimer lasers, immersion lithography, extreme ultra-violet (EUV) radiation, and/or combinations thereof. It is understood that additional layers may be formed above or below the photoresist layer 216, such as one or more antireflective coating layers (e.g., a top antireflective coating layer and/or a bottom antireflective coating layer). It is understood that, in some embodiments, the patterning process may utilize additional masks.

The patterned photoresist layer 216 comprising first and second portions 216A, 216B defines a first implant pattern. The first portions 216A are unprotected portions. The second portions 216B are protected portions that define the first implant pattern. Referring to FIG. 2E, the first, unprotected portions 216A of the photoresist layer 216 are removed to form the one or more first openings 218A having the first critical dimension $CD_1$. The first opening 218A exposes a portion of the first hard mask layer 214. The first critical dimension $CD_1$ comprises any suitable dimension. In the present embodiment, the first critical dimension $CD_1$ comprises a width of approximately 0.41 µm.

At step 110, the first hard mask layer 214 is then patterned to form one or more second openings substantially equal to the one or more first openings, wherein the second opening comprises the first critical dimension. The patterned photoresist layer 216 acts as a mask for patterning the first hard mask layer 214. More particularly, the protected, second portions 216B, which define the first implant pattern, act as a mask for patterning the first hard mask layer 214. As noted above, the first implant pattern comprises one or more first openings 218A that expose portions of the first hard mask layer 214. The exposed portions of the first hard mask layer 214 are removed to form one or more second openings 218B as shown in FIG. 2F. The one or more second openings 218B are substantially similar to the one or more first openings 218A. For example, the second opening 218B comprise the first critical dimension $CD_1$ (e.g., a width of approximately 0.41 µm). Subsequently, at step 112, the photoresist layer 216 (i.e., second portions 216B) may be removed by any suitable process, such as a photoresist stripping process.

The first, unprotected portions 216A and exposed portions of the first hard mask layer 214 are removed by any suitable process. It is understood that the first, unprotected portions 216A and exposed portions of the first hard mask layer 214 may be simultaneously or independently removed. For example, removing such portions may include an etching process. The etching process may include multiple etching steps and etching solutions to remove the first, unprotected portions 216A and/or exposed portion of the first hard mask layer 214. The etching process may comprise one or more dry etching processes, wet etching processes, other suitable etching methods (e.g., reactive ion etching), and/or combinations thereof. The etching process may also be either purely chemical (plasma etching), purely physical (ion milling), and/or combinations thereof. A wet etching process may utilize APM (ammonia/hydrogen peroxide mix) solution, hydrogen peroxide ($H_2O_2$), ozone ($O_3$), sulfuric acid ($H_2SO_4$), phosphoric acid ($H_3PO_4$), acetic acid ($CH_3COOH$), SPM, hydrochloric and hydrogen peroxide mixture (HPM), other suitable solutions, and/or combinations thereof. In some embodiments, a wet etching process utilizes a hydrofluoric acid (HF) solution for a HF dipping process. The HF solution may have any suitable concentration (e.g., 1:100). A dry etching process may implement an oxygen-containing gas, nitrogen-containing gas, flourine-containing gas, chlorine-containing gas, bromine-containing gas, iodine-containing gas, other suitable gases and/or plasmas, and/or combinations thereof. In some embodiments, a dry etching process may utilize SPM, DIW-$O_3$, $H_2O_2$, and/or combinations thereof.

Referring to FIGS. 1 and 2G, at step 114, a first implantation process 220 is performed on the substrate 210 (i.e., the exposed portions of the substrate 210 within the one or more second openings 218B). During the first implantation process 220, the first hard mask layer 214 protects various regions of the semiconductor substrate 210 from damage (e.g., penetration of dopant ions). The first implantation process 220 forms p-type and/or n-type doped regions 221 on the exposed portions of the substrate 210. For example, the first implantation process 220 may utilize p-type dopants, such as boron or $BF_2$; n-type dopants, such as phosphorus or arsenic; and/or combinations thereof. In some embodiments, the first implantation process 220 may utilize other implant species, such as silicon, germanium, fluorine, carbon, helium, neon, argon, nitrogen, other suitable species, and/or combinations thereof. The first implantation process 220 comprises any suitable implant energy and any suitable doping concentration. For example, the implant energy may be less than approximately 1 mega electron volt (MeV). In the present embodiment, the implant energy may be less than approximately 1.2 MeV. In some embodiments, the doping concentration ranges from approximately $1 \times 10^{12}$ atoms/cm$^3$ to $1 \times 10^{13}$ atoms/cm$^3$. In some embodiments, the doping concentration ranges form approximately $5 \times 10^{13}$ atoms/cm$^3$ to $8 \times 10^{13}$ atoms/cm$^3$. It is understood that the first implantation process 220 may comprise one or more implantation processes.

At step 116, a second hard mask layer 222 is formed over the first hard mask layer 214 to form one or more third openings 218C having a second critical dimension. The second hard mask layer 222 may be similar and/or different in composition to the first hard mask layer 214. In the present embodiment, the second hard mask layer 222 is similar in composition to the first hard mask layer 214 and comprises silicon oxide, silicon oxynitride, and/or silicon nitride. The second hard mask layer 222 may comprise SOG, FSG, carbon doped silicon oxide (e.g., SiCOH), Black Diamond® (Applied Materials of Santa Clara, Calif.), Xerogel, Aerogel, amorphous fluorinated carbon, Parylene, BCB, Flare, SiLK (Dow Chemical, Midland, Mich.), polyimide, TEOS oxide, PE oxide, HARP oxide, porous polymeric materials, non-porous polymeric materials, other suitable low-k dielectric materials, other suitable materials, and/or combinations thereof. In the present embodiment, the second hard mask layer 222 is formed by CVD and/or ALD. The second hard mask layer 222 may be formed by other suitable processes, such as PVD, PECVD, RTCVD, MOCVD, HPCVD, sputtering, plating, spin-on coating, other suitable processes, and/or combinations thereof. The second hard mask layer 222 may include a single layer or multiple layers. Further, the second hard mask layer 222 comprises any suitable thickness. In some embodiments, the first hard mask layer 214 may comprise a first portion of a hard mask layer, and the second hard mask layer 222 may comprise a second portion of a hard mask layer. The first and second portions may comprise the same material (i.e., forming an oxide layer) or different materials.

The second hard mask layer 222 defines a second implant pattern. By forming the second hard mask layer 222 over the first hard mask layer 214, the one or more second openings 218B having the first critical dimension $CD_1$ are essentially tightened (or reduced) to form the one or more third openings 218C having the second critical dimension $CD_2$, which define the second implant pattern. The second critical dimension $CD_2$ comprises any suitable dimension. In the present embodiment, the second critical dimension $CD_2$ is less than the first critical dimension $CD_1$. For example, the second critical dimension $CD_2$ may comprise a width of approximately 0.35 µm.

Referring to FIGS. 1 and 2I, at step 118, a second implantation process 224 is performed on the substrate 210. The second implantation process 224 may be similar to the first implantation process 220. During the second implantation process 224, the first hard mask layer 214 again protects various regions of the semiconductor substrate 210 from damage (e.g., penetration of dopant ions), and additionally, the second hard mask layer 222 protects portions of the substrate 210 that were exposed to the first implantation process 220, tightening the critical dimension for the second implantation process 224. The second implantation process 224 forms p-type and/or n-type doped regions 225 on the exposed portions of the substrate 210. For example, the second implantation process 224 may utilize p-type dopants, such as boron or $BF_2$; n-type dopants, such as phosphorus or arsenic; and/or combinations thereof. In some embodiments, the second implantation process 224 may utilize other implant species, such as silicon, germanium, fluorine, carbon, helium, neon, argon, nitrogen, other suitable species, and/or combinations thereof. The second implantation process 224 comprises any suitable implant energy and any suitable doping concentration. In the present embodiment, the second implantation process 224 is modified so that the implant energy may implant through the second hard mask layer 222. In some embodiments, the implant energy may be less than approximately 1 MeV or less than approximately 1.2 MeV. In some embodiments, the implant energy may be less than approximately 350 keV. In some embodiments, the doping concentration ranges from approximately $1\times10^{12}$ atoms/cm$^3$ to $1\times10^{13}$ atoms/cm$^3$. In some embodiments, the implant energy and/or doping concentration of the second implantation process 224 is less than the implant energy and/or doping concentration of the first implantation process 220. It is understood that the second implantation process 224 may comprise one or more implantation processes.

In summary, the disclosed embodiments may provide a method for fabricating an integrated circuit device utilizing one mask to perform different implantation processes associated with different implantation dimensions. The disclosed embodiments may provide one or more advantages, such as decreased processing costs, ease in improving spacing dimensions (e.g., critical dimensions for one or more implantation processes), ease in developing integrated circuit devices, and/or ease in extending the disclosed method to next-generation processing. It is understood that different embodiments may have different advantages, and that no particular advantage is necessarily required of all embodiments. In one example, the method may comprise depositing an oxide layer over a substrate; patterning the oxide layer to define a first implant pattern; performing a first implantation process; re-depositing the oxide layer to shrink (or tighten) the first implant pattern to define a second implant pattern; and performing a second implantation process, wherein an implant energy of the second implantation process may be modified to implant the substrate through the re-deposited oxide layer. The first implantation process and the first implant pattern may be associated with a first critical dimension, and the second implantation process and the second implant pattern may be associated with a second critical dimension. Essentially, the deposited and patterned oxide layer functions as a hard mask layer defining a critical dimension for the first implantation process, and the re-deposited oxide layer functions as a hard mask layer tightening (and defining) the critical dimension for the second implantation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, the method comprising:
   providing a substrate;
   depositing a first oxide layer over the substrate;
   patterning the first oxide layer to form a first opening having a first critical dimension, the first opening exposing the substrate, the exposed substrate having a width substantially equal to a width of the first opening;
   performing a first implantation process on the substrate through the one or more first openings;
   after performing the first implantation process, depositing a second oxide layer over the first oxide layer to form a second opening having a second critical dimension, wherein the second opening is formed by depositing the second oxide layer over the first oxide layer such that the second oxide layer is on and in direct contact with the exposed substrate thereby completely covering the exposed substrate; and
   performing a second implantation process on the substrate through the one or more second openings.

2. The method of claim 1 wherein the second critical dimension is less than the first critical dimension.

3. The method of claim 1 wherein patterning the first oxide layer to form the first opening having the first critical dimension comprises:
   forming a photoresist layer over the first oxide layer;
   patterning the photoresist layer to form an unprotected portion of the first oxide layer and a protected portion of the first oxide layer; and
   etching the unprotected portion of the first oxide layer.

4. The method of claim 1 wherein performing the second implantation process comprises modifying an implant energy of the second implantation process to implant through the second oxide layer.

5. The method of claim 1 wherein performing the first implantation process and performing the second implantation process each comprises utilizing p-type dopants or n-type dopants.

6. The method of claim 1, wherein the exposed substrate remains completely covered by the second oxide layer while performing the second implantation process.

7. A method for fabricating an integrated circuit device, the method comprising:
providing a substrate;
forming a first hard mask layer over the substrate, the first hard mask layer having a lower surface facing the substrate and an opposite facing upper surface;
patterning the first hard mask layer to form a first opening that exposes the substrate;
performing a first implantation process on the exposed substrate through the first opening to form a first doped region;
after performing the first implantation process, forming a second hard mask layer on and in direct contact with the upper surface of the first hard mask layer and the exposed substrate, such that a second opening is formed that is smaller than the first opening; and
performing a second implantation process on the substrate through the second opening to form a second doped region within the first doped region.

8. The method of claim 7 wherein forming the first hard mask layer and forming the second hard mask layer each comprises depositing a dielectric layer.

9. The method of claim 8 wherein depositing the dielectric layer comprises utilizing a chemical vapor deposition process or an atomic layer deposition process.

10. The method of claim 7 wherein the performing the first implantation process comprises utilizing a first implant energy and a first doping concentration and performing the second implantation process comprises utilizing a second implant energy and a second doping concentration.

11. The method of claim 7 wherein performing the first implantation process and performing the second implantation process each comprises utilizing boron or phosphorous.

12. The method of claim 7 wherein patterning the first hard mask layer to form the first opening comprises defining a first implant pattern having a critical dimension and wherein forming the second hard mask layer to form the second opening comprises tightening the critical dimension to define a second implant pattern.

13. The method of claim 7, wherein the exposed substrate has a width substantially equal to a width of the first opening.

14. The method of claim 7, wherein forming the second hard mask layer on and in direct contact with the first hard mask layer including the upper surface and the exposed substrate includes completely covering the exposed portion of the substrate with the second hard mask layer.

15. The method of claim 7, wherein the exposed substrate remains completely covered by the second hard mask layer while performing the second implantation process.

16. A method for fabricating an integrated circuit device, the method comprising:
providing a substrate;
defining a first implant pattern using a hard mask layer including one of silicon oxide, silicon nitride, silicon oxynitride, or combinations thereof, the first implant pattern exposing a portion of the substrate, the portion of the substrate having a width that is substantially equal to a width of a first opening defined by the first implant pattern;
defining a second implant pattern using the hard mask layer, wherein defining the second implant pattern using the hard mask layer includes the hard mask layer completely covering the portion of the substrate, wherein defining the first and second implant patterns utilizes a single masking step; and
performing at least two implantation processes on the substrate, wherein at least one implantation process is associated with the first implant pattern and at least one implantation process is associated with the second implant pattern, and further wherein the at least one implantation process associated with the second implant pattern includes performing the at least one implantation process through a portion of the hard mask layer, wherein the at least one implantation process associated with the first implant pattern is performed on the exposed portion of the substrate and prior to defining the second implant pattern, wherein the portion of the substrate remains completely covered by the hard mask layer while performing the at least one implantation process associated with the second implant pattern.

17. The method of claim 16 wherein defining the first implant pattern and the second implant pattern utilizing a single masking step comprises:
depositing a first portion of the hard mask layer over the substrate;
forming a photoresist layer over the first portion of the hard mask layer;
patterning the photoresist layer and the first portion of the hard mask layer, wherein the first portion of the hard mask layer forms the first opening having a first critical dimension; and
depositing a second portion of the hard mask layer over the first portion of the hard mask layer, wherein the first and second portions of the hard mask layer form a second opening having a second critical dimension.

18. The method of claim 17 wherein the second critical dimension is less than the first critical dimension.

19. The method of claim 16 wherein performing the at least one implantation process associated with the first implant pattern comprises forming a deep p-well structure or a deep n-well structure.

20. The method of claim 16 wherein performing the at least one implantation process associated with the second implant pattern comprises forming a p-well structure or an n-well structure.

* * * * *